United States Patent [19]

Chellis

[11] Patent Number: 4,597,996
[45] Date of Patent: Jul. 1, 1986

[54] PROCESS OF LAMINATING WITH AN EPOXY COMPOSITION

[75] Inventor: Leroy N. Chellis, Endwell, N.Y.

[73] Assignee: International Business Machines Corporation, Armonk, N.Y.

[21] Appl. No.: 778,055

[22] Filed: Sep. 20, 1985

Related U.S. Application Data

[62] Division of Ser. No. 600,619, Apr. 16, 1984, Pat. No. 4,550,128.

[51] Int. Cl.$^4$ ............................................... B05D 3/02
[52] U.S. Cl. .................................. 427/386; 427/96; 427/389.9; 427/393.5; 427/404; 427/407.3; 427/412.1; 428/394
[58] Field of Search ............... 427/386, 389.9, 393.5, 427/404, 407.3, 412.1, 96; 523/433, 454; 525/482, 507, 527; 428/394

[56] References Cited

U.S. PATENT DOCUMENTS

| | | | |
|---|---|---|---|
| 3,016,362 | 1/1962 | Wismer | 260/42 |
| 3,086,888 | 4/1963 | Stratton et al. | 117/212 |
| 3,218,369 | 11/1965 | Hinkley et al. | 260/830 |
| 3,268,619 | 8/1966 | Nametz | 260/831 |
| 3,378,434 | 4/1968 | Harrington | 161/184 |
| 3,888,942 | 6/1975 | Tsen | 260/830 |
| 3,957,716 | 5/1976 | Weldy | 260/37 EP |
| 3,983,056 | 9/1976 | Hosoda et al. | 260/29.2 EP |
| 4,009,223 | 2/1977 | Noonan | 260/830 TW |
| 4,040,993 | 8/1977 | Elbling et al. | 260/18 EP |
| 4,075,260 | 2/1978 | Tsen et al. | 260/830 |
| 4,077,927 | 3/1978 | McPherson | 260/237 N |
| 4,169,187 | 9/1979 | Glazer | 428/418 |
| 4,251,426 | 2/1981 | McClure et al. | 260/37 EP |
| 4,474,929 | 10/1984 | Schrader | 525/482 |

*Primary Examiner*—Theodore E. Pertilla
*Attorney, Agent, or Firm*—Pollock, Vande Sande & Priddy

[57] ABSTRACT

A composition suitable for making circuitboards containing two different brominated epoxy polymeric components which are brominated diglycidyl ethers of bisphenol-A and epoxidized nonlinear novolak having at least about six terminal epoxy groups.

18 Claims, No Drawings

PROCESS OF LAMINATING WITH AN EPOXY COMPOSITION

This is a division of application Ser. No. 600,619, filed Apr. 16, 1984, now U.S. Pat. No. 4,550,128.

DESCRIPTION OF INVENTION

1. Technical Field

The present invention is concerned with a composition containing an epoxidized nonlinear novolak having at least six terminal epoxy groups.

The compositions of the present invention are especially suitable as the matrix material for printed circuitboards. In particular, the present invention is concerned with a composition which has excellent shelf life, high temperature performance when cured, and good adhesion to copper.

2. Background Art

Circuitboards find a wide variety of uses in the electrical industry such as for radios, televisions, appliances, and various electrical apparatus. A widely employed technique for preparing circuitboards is to impregnate a woven fiberglass sheet with a resin composition and then laminate a copper sheet to one or both sides of the resin impregnated fiberglass sheet. Next, an electrical circuit is etched into the copper to form the circuitboard and then electrical connections can be soldered to the board when it is used.

Various resins have been suggested for the purpose of impregnating the fiberglass to prepare the circuitboards. For instance, polyimide resins have been used for such purpose. The use of the polyimide resins provides good quality circuitboards which possess high resistance to elevated temperatures, low thermal expansion, and good electrical properties including high electrical resistivity. However, circuitboards prepared from polyimide resins are relatively expensive when compared to circuitboards prepared from epoxy resin impregnated fiberglass sheets. Circuitboards of epoxy resin impregnated fiberglass sheets, although much less expensive than those prepared using polyimide resins, are not especially resistant to high temperatures, have reduced electrical properties and higher thermal expansion when compared to circuitboards of polyimide resin impregnated fiberglass sheets. In addition, other types of resin systems have been suggested for this purpose. For instance, a combination of certain epoxy resins and certain specific bismaleimide materials are suggested in U.S. Pat. Nos. 4,294,877 and 4,294,743.

Resin composition, when cured, should desirably exhibit a relatively high glass transition temperature and possess high resistance to elevated temperatures. Accordingly, compositions to be suitable as the matrix material for integrated circuitboards must possess a number of diverse characteristics including relatively high glass transition temperature when cured, solubility and stability in low boiling point solvents, adhesion to the fiberglass sheets, low thermal expansion, and high electrical resistivity.

SUMMARY OF INVENTION

The present invention provides a composition which exhibits extraordinary stability characteristics in low boiling point solvents. In addition, the compositions of the present invention have very high resistance to elevated temperatures and have very low thermal expansion characteristics when cured.

The compositions of the present invention contain:

(A) about 25 to about 30 parts by weight of a tetrabrominated diglycidyl ether of bisphenol-A having an epoxy equivalent weight of about 350 to about 450;

(B) about 10 to about 15 parts by weight of a tetrabrominated diglycidyl ether of bisphenol-A having an epoxy equivalent weight of about 600 to about 750; and (C) about 55 to about 65 parts by weight of at least one epoxidized nonlinear novolak having at least six terminal epoxy groups.

The above amounts are based upon the total of (A), (B), and (C) in the composition.

The present invention is also concerned with a product comprising a fibrous substrate impregnated with the composition discussed above and a curing agent.

BEST AND VARIOUS MODES FOR CARRYING OUT THE INVENTION

The epoxidized novolak employed in the present invention must be nonlinear (e.g., highly branched chain) and must contain at least about six terminal epoxy groups and preferably about eight terminal epoxy groups. Epoxidized novolak polymers are commercially available and can be prepared by known methods by the reaction of a thermoplastic phenolic-aldehyde of a polynuclear dihydric phenol with a halo-epoxy alkane.

The polynuclear dihydric phenol can have the formula:

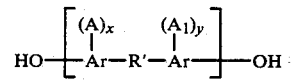

wherein Ar is an aromatic divalent hydrocarbon such as naphthylene and preferably phenylene; A and $A_1$, which can be the same or different, are alkyl radicals, preferably having from 1 to 4 carbon atoms; halogen atoms, i.e., fluorine, chlorine, bromine, and iodine, or alkoxy radicals preferably having from 1 to 4 carbon atoms; x and y are integers having a value 0 to a maximum value corresponding to the number of hydrogen atoms on the aromatic radical (Ar) which can be replaced by substituents; and $R^1$ is a bond between adjacent carbon atoms as in dihydroxydiphenyl or is a divalent radical including, for example:

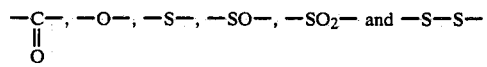

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others: The bis-(hydroxyphenyl)alkanes such as:

2,2-bis-(4-hydroxyphenol)propane,
2,4'-dihydroxydiphenylmethane, bis-(2-hydroxyphenyl)methane,
bis-(4-hydroxyphenyl)methane,
bis(4-hydroxy-2,6-dimethyl-3-methoxyphenyl)methane,
1,1-bis-(4-hydroxyphenyl)methane,
1,2-bis-(4-hydroxyphenyl)ethane,
1,1-bis-(4-hydroxy-2-chlorophenyl)ethane,
1,1-bis(3-methyl-4-hydroxyphenyl)ethane,
1,3-bis-(3-methyl-4-hydroxyphenyl)propane,
2,2-bis-(3-phenyl-4-hydroxyphenyl)propane, 2,2-bis-(3-isopropyl-4-hydroxyphenyl)propane,
2,2-bis(2-isopropyl-4-hydroxyphenyl)propane,
2,2-bis(4-hydroxynaphthyl)propane,
2,2-bis-(4-hydroxyphenyl)pentane,
3,3-bis-(4-hydroxyphenyl)pentane,
2,2-bis-(4-hydroxyphenyl)heptane,
bis-(4-hydroxyphenyl)phenylmethane,
bis-(4-hydroxyphenyl)cyclohexylmethane,
1,2-bis-(4-hydroxyphenyl)-1,2-bis-(phenyl)propane, and
2,2-bis-(4-hydroxyphenyl)-1-phenyl-propane;
di(hydroxyphenyl)sulfones such as
bis-(4-hydroxyphenyl)sulfone,
2,4'-dihydroxydiphenyl sulfone,
5'-chloro-2,4'-dihydroxydiphenyl sulfone, and
5'-chloro-4,4'-dihydroxydiphenyl sulfone;
di(hydroxyphenyl)ethers such as
bis-(4-hydroxyphenyl)ether,
the 4,3'-, 4,2'-, 2,2'-, 2,3'-, dihydroxydiphenyl ethers,
4,4'-dihydroxy-2,6-dimethyldiphenyl ether,
bis-(4-hydroxy-3-isobutylphenyl)ether,
bis-(4-hydroxy-3-isopropylphenyl)ether,
bis-(4-hydroxy-3-chlorophenyl)ether,
bis-(4-hydroxy-3-fluorophenyl)ether,
bis-(4-hydroxy-3-bromophenyl)ether,
bis(4-hydroxynaphthyl)ether,
bis(4-hydroxy-3-chloronaphthyl)ether,
bis(2-hydroxydiphenyl)ether,
4,4'-dihydroxy-2,6-dimethoxydiphenyl ether, and
4,4'-dihydroxy-2,5-diethoxydiphenyl ether.

The preferred dihydric polynuclear phenols are represented by the formula:

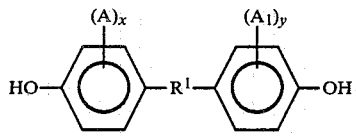

wherein A and $A_1$ are as previously defined; x and y have values from 0 to 4 inclusive; and $R^1$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2-bis-(p-hydroxyphenyl)propane.

As condensing agents, any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, and hexamethylene tetramine. The aldehydes can also be used in the form of a solution, such as the commercially available formalin. The preferred aldehyde is formaldehyde.

The halo-epoxy alkane can be represented by the formula:

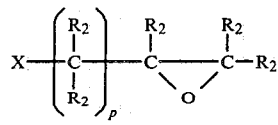

wherein X is a halogen atom (e.g., chlorine, bromine, and the like); p is an integer from 1 to 8; each $R_2$, individually, is hydrogen or alkyl group of up to 7 carbon atoms; wherein the number of carbon atoms in any epoxy alkyl group totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as:
1-chloro2,3-epoxybutane,
1-chloro-3,4-epoxybutane,
2-chloro-3,4-epoxybutane,
1-chloro-2-methyl-2,3-epoxypropane,
1-bromo-2,3-epoxypentane,
2-chloromethyl-2,2-epoxybutane,
1-bromo-4-methyl-3,4-epoxypentane,
1-bromo-4-ethyl-2,3-epoxypentane,
4-chloro-2-methyl-2,3-epoxypentane,
1-chloro-2,3-epoxyoctane,
1-chloro-2-methyl-2,3-epoxyoctane, or
1-chloro-2,3-epoxydecane.

Although it is possible to use haloepoxyalkanes having a greater number of carbon atoms than indicated above, there is generally no advantage in using those having a total of more than 10 carbon atoms.

The preferred epoxidized novolak employed in the present invention is represented by the average formula:

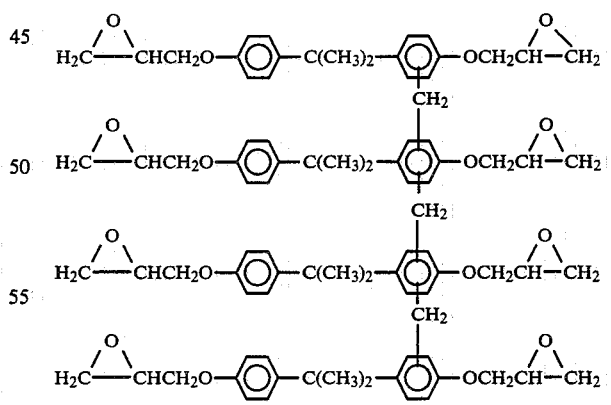

Such is commercially available under the trade designation EPI-REZ SU8.

The compositions of the present invention also contain two different tetrabrominated diglycidyl ethers of bisphenol-A. The tetrabrominated diglycidyl ethers of bisphenol-A employed in the compositions of the present invention are well-known and commercially available. Such can be obtained by reacting tetrabrominated bisphenol-A with a halo-epoxy alkane. The halo-epoxy alkanes can be represented by the formula:

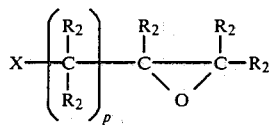

wherein X is a halogen atom (e.g., chlorine and bromine); p is an integer from 1 to 8; each $R_2$, individually is a hydrogen or alkyl group of up to 7 carbon atoms; wherein the number of carbon atoms in any epoxy alkyl group totals no more than 10 carbon atoms. The preferred haloepoxy alkane is epichlorohydrin.

The first brominated epoxy polymer employed has an epoxy equivalent weight of about 350 to about 450, and most preferably about 380 to about 420.

The second brominated epoxy polymer employed has an epoxy equivalent weight of about 600 to about 750, and preferably about 650 to about 700.

The compositions of the present invention contain about 55 to about 65, and preferably about 58 to about 62 parts by weight of the (A) epoxidized nonlinear novolak; about 25 to about 30, and preferably about 27 to about 29 parts by weight of the (B) brominated epoxy having an epoxy equivalent weight of about 350 to about 450, and about 10 to about 15, and preferably about 11 to about 13 parts by weight of the (C) brominated epoxy having an epoxy equivalent weight of about 600 to about 750.

The above amounts are based upon the total of (A), (B), and (C) in the composition.

The use of two different brominated epoxy materials is essential for providing the properties achieved by the present invention. In particular, the brominated epoxy materials provide the necessary degree of flame retardancy of the cured product. However, use of the brominated epoxy material having the epoxy equivalent weight of about 350 to about 450 without the other brominated epoxy material results in the crystallization of the brominated epoxy material out of solution within a few days of preparation of a solution of the polymeric materials. On the other hand, use of the brominated epoxy material having the epoxy equivalent weight of about 600 to about 750 without the other brominated epoxy material does not provide the necessary high glass transition temperature (Tg) requirement for use in preparing circuitboards.

Accordingly, the combination provides for a stable solution, as well as a high glass transition temperature when cured. Compositions of the present invention, when cured, preferably have a Tg of about 175° C. or greater.

Moreover, the compositions of the present invention, in the absence of hardners and/or accelerators, have good shelf life.

Use of the compositions of the present invention in preparing circuitboards result in reduced smearing due to drilling of holes in the boards.

The compositions of the present invention are preferably in the form of liquid preparation in an organic solvent. The solvent is preferably a low boiling point solvent such as methyl cellosolve, and most preferably is a ketone such as acetone, methylethyl ketone, and methylisobutyl ketone. The solvent is present in amounts of about 90 to about 120 parts, and preferably about 100 to about 116 parts by weight per 100 parts of the solid materials in the composition.

In addition, just prior to use, a hardener and an accelerator or a catalyst are generally added to the compositions of the present invention to facilitate curing of the compositions.

Suitable hardeners include the novolak hardeners such as phenolic-type aldehyde novolaks. The phenolic portion can be from phenol or substituted phenols such as m-cresol, p-cresol, and the xylenols. The aldehyde reactant is preferably formaldehyde. The aldehyde reactant is preferably formaldehyde. Suitable hardeners include Ciba HT9490, a cresol-novolac with equivalent weight of 126, Celanese EpiCure 8451, a modified phenolic-novolac with equivalent weight of 110, Durez 16227, and Bakelite BV9700. A preferred hardener is Celanese EpiCure RDX58470, a modified phenolic-novolac with equivalent weight of 110 which is similar to EpiCure 8451, except that it contains less accelerator (e.g.—hexamethylene tetraamine). An idealized formula for this hardener is as follows:

The hardener may contain small percentages of an amine, such as hexamethylene tetraamine to increase its reactivity. Durez 16227 and Bakelite BV9700 are similar phenolic-novolac hardeners which could be used.

The hardener is generally employed in amounts of about 36 to about 48, and preferably about 40 to about 44 parts per hundred parts by weight of the total of the epoxidized nonlinear novolak and two brominated epoxy polymeric components.

The accelerating or curing agent includes such known curing agents for epoxy polymers as the imide-, imine-, and amine-type curing agents. Examples of some suitable imides include 2-methylimidazole; and 2,4 methyl ethyl imidazole (EMI-24). Examples of some suitable amines include diethylenetriamine, 2,4,6-tris-N,N'-dimethylaminoethyl phenol, triethylenetetramine, tetraethylenepentamine, and benzyl dimethylamine. The curing agent is generally employed in amounts of about 0.05 to about 0.4, and preferably abut 0.1 to about 0.2 parts by weight per hundred parts of the total of epoxidized nonlinear novolak and two brominated epoxy polymeric components The compositions of the present invention are preferably employed to prepare printed circuitboards. In preparing the boards, a fibrous substrate is coated and impregnated with the composition of the present invention. Conventional coating equipment can be employed. Subsequent to coating, the impregnated substrate is dried and partially cured at a temperature of about 140° C. to about 160° C. for about 2 to about 6 minutes to form a dry substrate called a prepreg. The compositions can be used to coat and/or impregnate fibrous substrates such as fiberglass, polyimides, and graphite.

After the prepreg is formed, a sheet of copper or other conductive material can then be laminated to one or more layers of prepreg using laminating conditions such as about 50 to about 800 pounds per square inch, about 150° C. to 200° C. for about 30 minutes to about 5 hours. Then a circuit can be etched to the conductive layer using techniques well-known to form circuitboards. The laminates prepared in accordance with the present invention exhibit good resistance to copper peeling.

The following non-limiting example is presented to further illustrate the present invention.

EXAMPLE 1

About 60 parts by weight of EPI-REZ SU-8, an octofunctional epoxy polymer, about 28 parts by weight of a brominated epoxy polymer having an epoxy equivalent weight of about 400, and available under the trade designation EPIREZ 5163 from Celanese Corporation, about 12 parts by weight of a brominated epoxy polymer having an epoxy equivalent of about 650 and available under the trade designation EPIREX 5183; and about 110 parts by weight of methyl ethyl ketone are admixed. The above composition is stable at room temperature for at least three months.

The composition is mixed with about 42 parts by weight of a phenolic-novolak hardener available from Celanese under the trade designation EPICURE RDX58470 and about 0.1 parts by weight of benzyl dimethylamine.

The composition is used to impregnate glass fibers and a laminate is made from the impregnate by pressing together 13 layers with 1 oz./ft$^2$ electrolytic copper foil (pretreated commercially for adhesion on each side) at 170° C., 300 psi for about 1 hour. A copper peel strength of 6.4 to 6.7 #/inch is obtained. The glass transition temperature is about 175° C. The laminate has good flammability characteristics sufficient to meet UL94-VO requirements.

What is claimed is:

1. A process for preparing a laminate which comprises impregnating a fibrous substrate with a composition of:
   (A) about 25 to about 30 parts by weight of a tetrabrominated diglycidyl ether of bisphenol-A having an epoxy equivalent weight of about 350 to about 450;
   (B) about 10 to about 15 parts by weight of a second and different tetrabrominated diglycidyl ether of bisphenol-A having an epoxy equivalent weight of about 600 to about 750; and
   (C) about 55 to about 65 parts by weight of at least one epoxidized non-linear novolak having at least six terminal epoxy groups; and then pressing together multiple layers of such an impregnate; and then curing at a temperature of about 150° C. to about 200° C. under pressure of about 300 psi for about 1 to about 5 hours.

2. The process of claim 1 wherein said fibrous substrate is fiberglass.

3. The process of claim 1 which further includes laminating a conductive material onto the cured substrate employing a pressure of about 150 to about 400 psi at a temperature of about 150° C. to about 200° C. for about 30 minutes to about 5 hours.

4. The process of claim 1 wherein said composition further contains a hardening agent for the composition.

5. The process of claim 4 wherein said hardening agent is a phenolic-novolak hardener.

6. The process of claim 4 wherein said composition further includes an accelerating agent for said composition.

7. The process of claim 6 wherein said accelerating agent is benzyldimethylamine.

8. The process of claim 1 wherein said novolak has at least eight terminal epoxy groups.

9. The process of claim 1 wherein said novolak has the average formula:

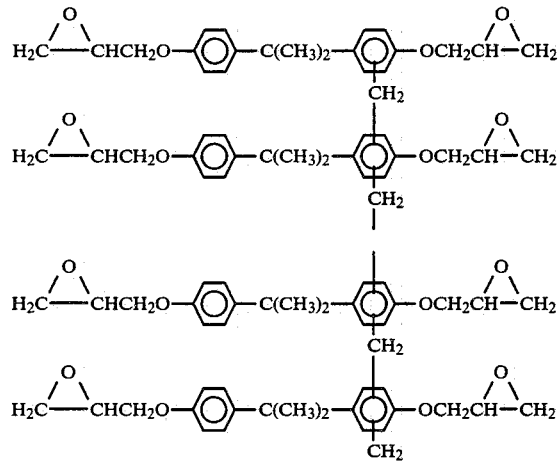

10. The process of claim 1 wherein (A) has an epoxy equivalent weight of about 400 and (B) has an epoxy equivalent weight of about 650.

11. The process of claim 1 wherein said composition contains about 28 parts by weight of (A); about 12 parts by weight of (B); and about 60 parts by weight of (C).

12. The process of claim 11 wherein (A) has an epoxy equivalent weight of about 400; and (B) has an epoxy equivalent weight of about 650.

13. The process of claim 1 wherein said composition further includes an organic diluent.

14. The process of claim 13 wherein said organic diluent is present in an amount of about 90 to about 120 parts by weight per hundred parts of the total of (A), (B), and (C).

15. The process of claim 13 wherein said organic diluent is present in an amount of about 100 to about 116 parts by weight.

16. The process of claim 13 wherein said organic diluent is a ketone.

17. The process of claim 16 wherein said ketone is methylethyl ketone.

18. The process of claim 1 wherein said composition contains about 27 to about 29 parts by weight of (A); about 11 to about 13 parts by weight of (B); and about 58 to about 62 parts by weight of (C).

* * * * *

UNITED STATES PATENT AND TRADEMARK OFFICE
CERTIFICATE OF CORRECTION

PATENT NO. : 4,597,996

DATED : July 1, 1986

INVENTOR(S) : Chellis

It is certified that error appears in the above-identified patent and that said Letters Patent is hereby corrected as shown below:

Column 6, lines 13, 15, 18, and 25, delete each occurrence of the word "novolac" and insert therefor the word -- novolak --.

Signed and Sealed this

Thirteenth Day of October, 1987

Attest:

DONALD J. QUIGG

Attesting Officer

Commissioner of Patents and Trademarks